United States Patent
Choi et al.

(10) Patent No.: US 7,502,021 B2
(45) Date of Patent: Mar. 10, 2009

(54) STACKED STRUCTURE DISPLAY DEVICE

(75) Inventors: Jin-Hyun Choi, Suwon-si (KR);
Kyoung-Soo Lee, Suwon-si (KR);
Sung-Chon Park, Suwon-si (KR)

(73) Assignee: Samsung SDI Co., Ltd., Suwon-si (KR)

(*) Notice: Subject to any disclaimer, the term of this patent is extended or adjusted under 35 U.S.C. 154(b) by 480 days.

(21) Appl. No.: 11/076,784

(22) Filed: Mar. 8, 2005

(65) Prior Publication Data
US 2005/0231124 A1    Oct. 20, 2005

(30) Foreign Application Priority Data
Mar. 9, 2004    (KR) ............. 10-2004-0015915

(51) Int. Cl.
*G09G 5/00* (2006.01)
(52) U.S. Cl. .................... 345/211; 345/4
(58) Field of Classification Search .......... 345/60, 345/76, 204, 211, 88–100, 80, 87, 205, 4; 174/255, 260, 261, 262; 333/243, 246, 247, 333/1, 12; 361/792, 793, 794, 795, 816, 361/818, 780; 315/169.3
See application file for complete search history.

(56) References Cited

U.S. PATENT DOCUMENTS

| | | | | |
|---|---|---|---|---|
| 5,587,920 A | * | 12/1996 | Muyshondt et al. | ........... 716/15 |
| 5,592,391 A | * | 1/1997 | Muyshondt et al. | ........... 716/15 |
| 6,047,469 A | * | 4/2000 | Luna | ........... 29/830 |
| 6,681,483 B2 | * | 1/2004 | Crescenzi et al. | ........... 29/852 |
| 7,119,871 B2 | * | 10/2006 | Nakayoshi et al. | ........... 349/138 |
| 2002/0113673 A1 | * | 8/2002 | Crescenzi et al. | ........... 333/247 |
| 2003/0123238 A1 | * | 7/2003 | Yu et al. | ........... 361/780 |
| 2003/0196749 A1 | * | 10/2003 | Japp et al. | ........... 156/250 |
| 2005/0092520 A1 | * | 5/2005 | Chao et al. | ........... 174/260 |

FOREIGN PATENT DOCUMENTS

JP    10313178 A    * 11/1998

* cited by examiner

*Primary Examiner*—Nitin Patel
(74) *Attorney, Agent, or Firm*—Christie, Parker & Hale, LLP

(57) ABSTRACT

A stacked structure of a display device is capable of preventing conductive noise due to signal interference by isolating analog and digital output stages and a ground stage onto different layers. A driving device of an organic light emitting display has a scan driver for applying a plurality of scan signals, a data driver for applying a plurality of data signals, and a controller for providing a gradation voltage to the data driver and a scan signal to the scan driver. The stacked structure includes a ground layer, an analog signal-transmission layer for transmitting an analog signal, a digital signal-transmission layer for transmitting a digital signal and a power supply transmission layer for transmitting a power supply voltage. Each of the layers is formed on a different layer. Further, the stacked structure further includes a first mounting layer at a front of the structure on which circuits are mounted and a second mounting layer at a rear thereof on which circuits are mounted. The stacked structure further includes insulating layers formed between the respective layers to insulate the layers.

18 Claims, 3 Drawing Sheets

STACKED STRUCTURE DISPLAY DEVICE

CROSS-REFERENCE TO RELATED APPLICATION

This application claims priority to and the benefit of Korean Patent Application No. 2004-15915, filed Mar. 9, 2004, the disclosure of which is incorporated herein by reference in its entirety.

BACKGROUND OF THE INVENTION

1. Field of the Invention

The present invention relates to a display device and, more particularly, to a stacked structure (Printed Circuit Board) of a display device capable of preventing conductive noise due to signal interference by isolating analog and digital output stages and a ground stage onto different layers.

2. Description of the Related Art

Currently, various flat display devices having reduced weight and volume are being developed that overcome weight and volume disadvantages common to cathode ray tubes. These flat display devices include liquid crystal displays, field emission displays, plasma display panels, organic light emitting displays, and the like. Of these, an example of an organic light emitting display is shown in FIG. 1.

FIG. 1 is a plan view illustrating a general organic light emitting display.

Referring to FIG. 1, the display device includes a display panel 30 for displaying a predetermined image, a controller 10 for applying a driving control signal and a data signal to the display panel 30, and a connector 20 for connecting the controller 10 to the display panel 30.

Here, the controller 10 includes a control unit 12 and a DC-DC converter 13. The controller applies data signals and a power supply to each pixel along with the driving control signal to the display panel 30 via the connector 20. The display panel 30 causes a plurality of unit pixels to emit light in response to the driving control signals and the data signals from the controller 10.

Further, the controller 10 has an output stage 14 at one side thereof to which a first connection stage 21 of the connector 20 is connected. Further, the display panel 30 has an input stage 31 at one side thereof to which a second connection stage 22 of the connector 20 is connected. Accordingly, the data signals and power supply outputted from the controller 10 are applied to the output stage 14 via a printed circuit of the printed circuit board (PCB) 11 and are transmitted to the display panel 30 via the connector 20. Here, in one embodiment the connector 20 preferably is a PCB or flexible printed circuit board (FPCB).

FIG. 2 schematically shows a sectional and conceptual view of a stacked structure of a conventional display device.

As shown, in the conventional display device, first and second mounting layers 11a and 11b are formed at the front and rear of the conventional display device. Also thereon components such as the control unit 12, the DC-DC converter 13 and the like are mounted, and an output layer 11b connected with the components of the controller 10 through a via hole (not shown), and a ground layer 11c for grounding signals in the components are formed.

The output layer 11b includes a signal line for transmitting the control signal outputted from the control unit 12, and a power supply line for transmitting the power supply voltage outputted from the DC-DC converter 13. The digital signal and the analog signal outputted from the control unit 12 and the power supply voltage outputted from the DC-DC converter 13 are transmitted via the output layer 11b.

Further, the connector 20 is generally formed from the PCB or FPCB as described above, and is composed of only the output layer 11b and the ground layer 11c, having no first and second mounting layers 11a and 11d in the mounting area of the controller 10 described above.

A problem with the stacked structure of such a conventional display device is that because the signal line and the power supply line are not isolated, or the digital signal and the analog signal are transmitted on the same layer, conductive noise due to signal interference is caused.

SUMMARY OF THE INVENTION

The present invention, therefore, solves the aforementioned problems associated with conventional devices by providing a stacked structure display device formed from a plurality of layers. A digital signal and an analog signal is transmitted using different layers so that conductive noise by signal interference is prevented.

In an exemplary embodiment of the present invention, a stacked structure display device is provided having a scan driver for applying a plurality of scan signals, a data driver for applying a plurality of data signals, and a controller for providing a gradation voltage to the data driver and a scan signal to the scan driver. The stacked structure comprises a ground layer, an analog signal-transmission layer for transmitting an analog signal, a digital signal-transmission layer for transmitting a digital signal, and a power supply transmission layer for transmitting a power supply voltage. Each of the aforementioned layers is formed as a separate layer.

The stacked structure may further include a first mounting layer at a front of the stacked structure on which circuits are mounted and a second mounting layer at a rear thereof on which circuits are mounted.

The stacked structure may further include insulating layers formed between the respective layers to insulate the layers.

The stacked structure may further be a flexible printed circuit board (FPCB).

The stacked structure may further be a printed circuit board (PCB).

The display device may be a flat display device.

The flat display device may be a liquid crystal display or an organic light emitting display.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Hereinafter, an exemplary embodiment of the present invention will be described in detail with reference to the accompanying drawings.

Figure 1:
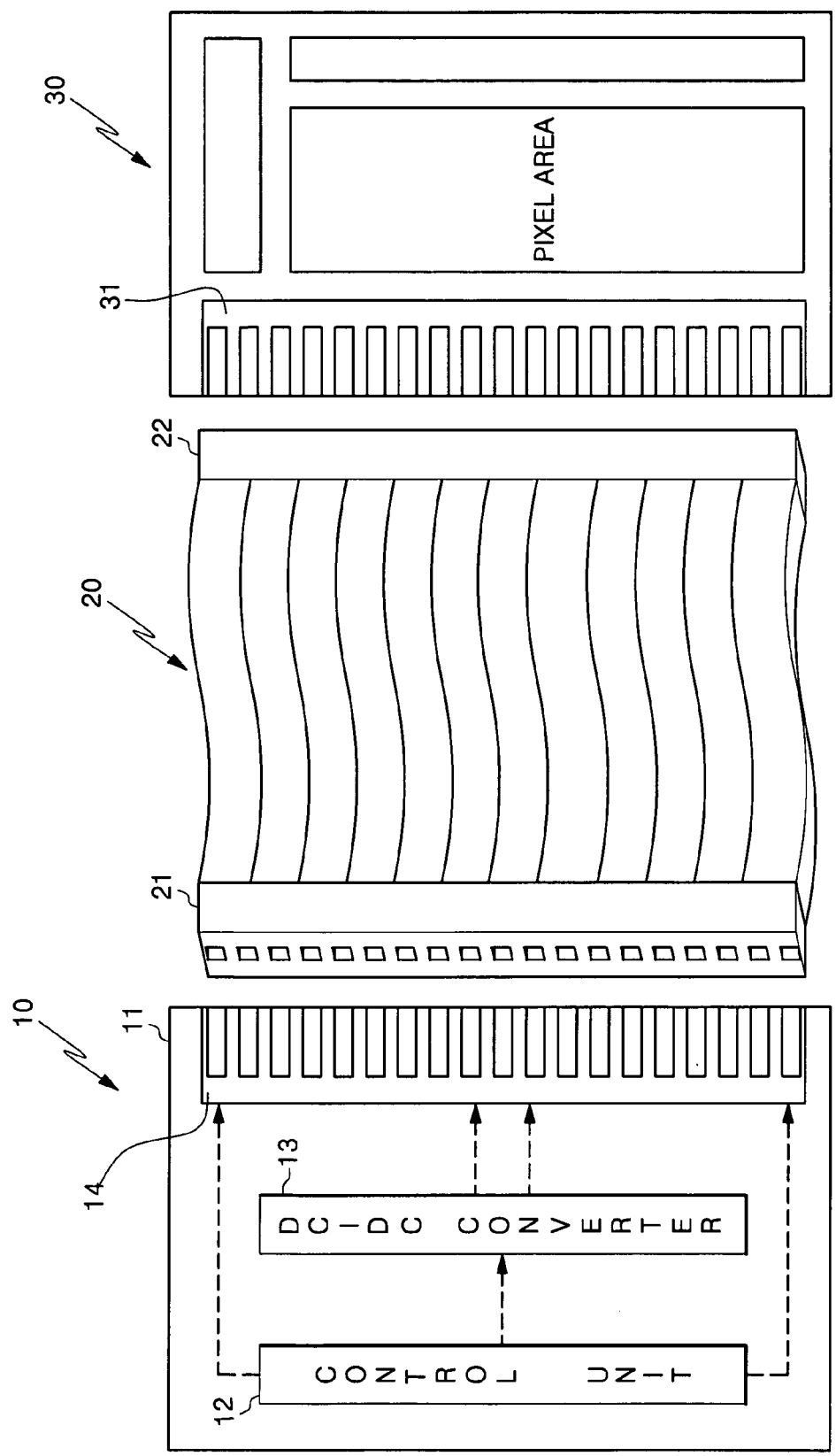
FIG. 1 is a plan view illustrating a general display device.
Figure 2:
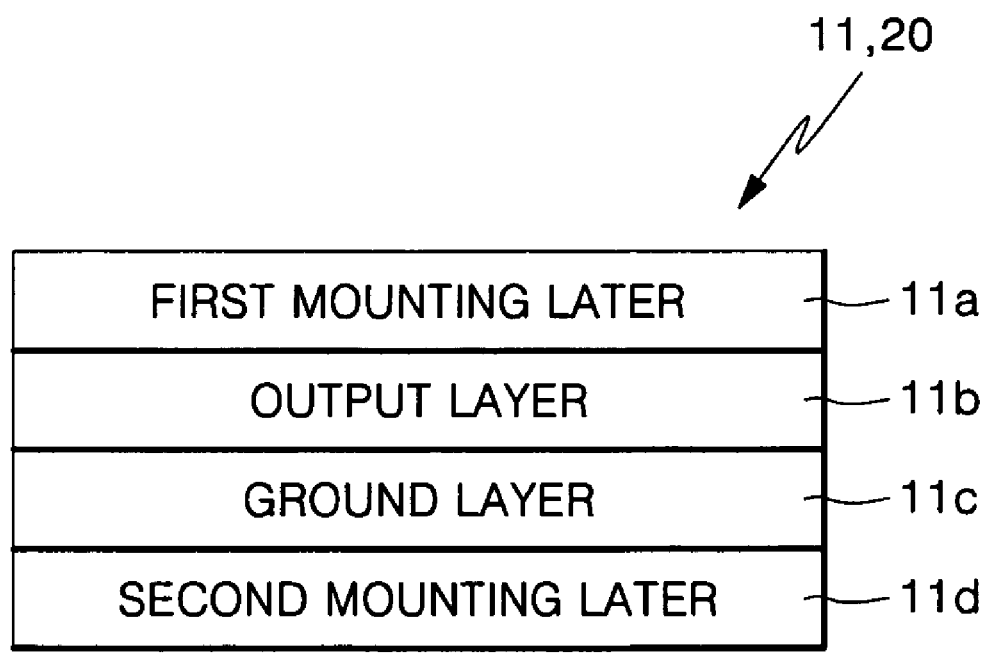
FIG. 2 is a conceptual, sectional view of a stacked structure of a conventional display device.
Figure 3:
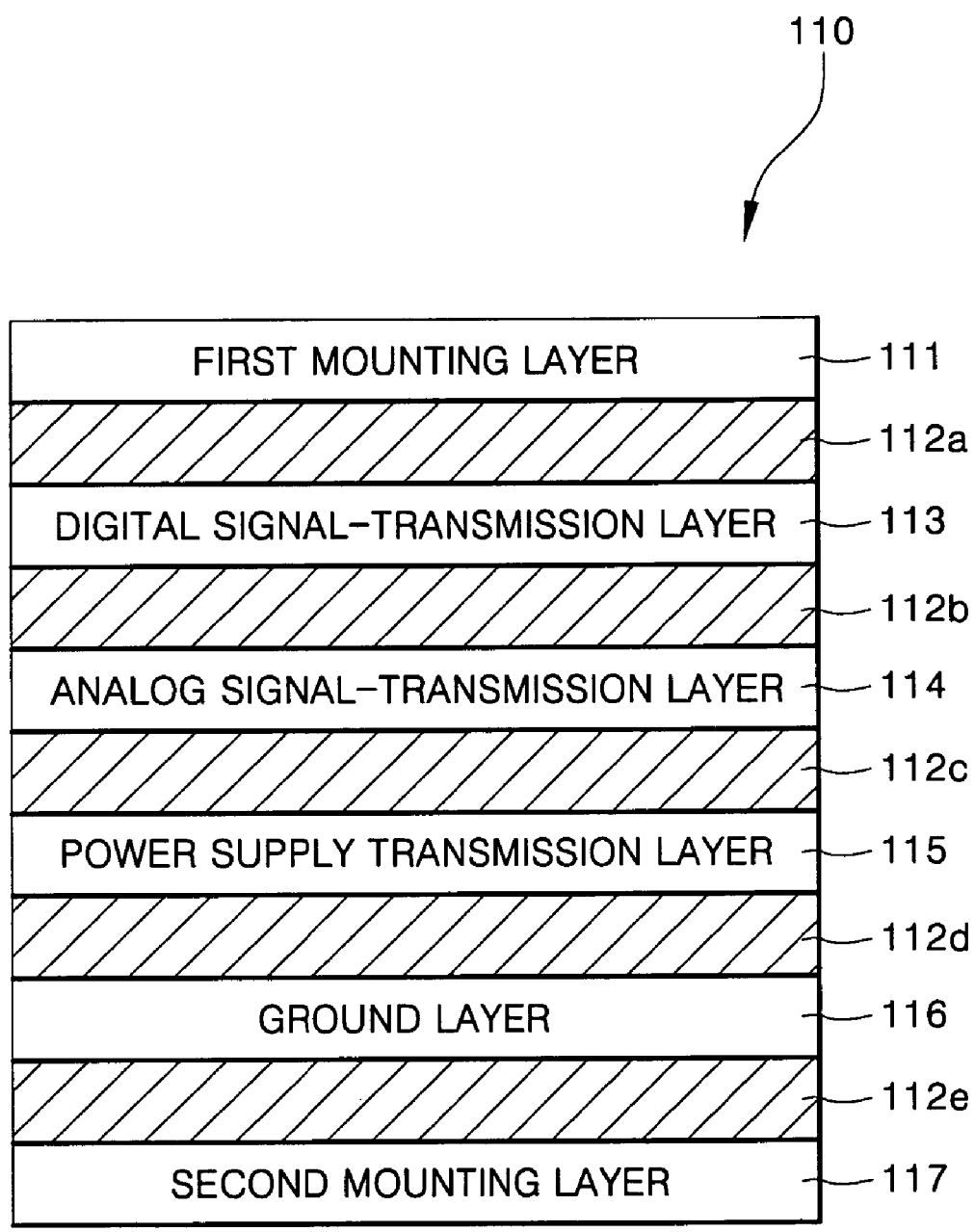
FIG. 3 is a conceptual, sectional view of a stacked structure of a display device according to an exemplary embodiment of the present invention having an isolated structure.

FIG. 3 is a conceptual, sectional view illustrating a stacked structure of a display device according to an exemplary embodiment of the present invention. The configuration of the display device of FIG. 1 is referred to for the purpose of a detailed description.

Components of the controller 11, such as the control unit 12 and the DC-DC converter 13, are mounted on a first mounting layer 111 and a second mounting layer 117. A ground layer 116 grounds the signals in the components mounted on the first mounting layer 111 and the second mounting layer 117. A digital signal-transmission layer 113 transmits the digital signals outputted from the components mounted on the first mounting layer 111 and the second mounting layer 117 to the output stage 14. An analog signal-transmission layer 114 transmits analog signals outputted from the components mounted on the first mounting layer 111 and the second mounting layer 117 to the output stage 14. A power supply transmission layer 115 transmits a power supply voltage and a cathode voltage outputted from the DC-DC converter 13 to the output stage 14.

Referring to FIG. 3, the first mounting layer 111 and the second mounting layer 117 on which the control unit 12 and the DC-DC converter 13 of the controller 10 are mounted are formed at the front and rear of the stacked structure, the digital signal-transmission layer 113 is formed below the first mounting layer 111, and a first insulating layer 112a is formed between the first mounting layer 111 and the digital signal-transmission layer 113 to electrically isolate the first mounting layer 111 from the digital signal-transmission layer 113. Furthermore, a second insulating layer 112b is formed under the digital signal-transmission layer 113, and the analog signal-transmission layer 114 is formed under the second insulating layer 112b. In addition, a third insulating layer 112c is formed under the analog signal-transmission layer 114, and a power supply transmission layer 115 is formed under the third insulating layer 112c. A fourth insulating layer 112d is formed under the power supply transmission layer 115, and the ground layer 116 is formed under the fourth insulating layer 112d.

In the stacked structure 110 of the display device described above, for example, a digital signal of 3.3V generated by the controller 10 is outputted from the component mounted on the first mounting layer 111 or the second mounting layer 117, and is applied to the digital signal-transmission layer 113 through a via hole (not shown) connected from the first mounting layer 111 or the second mounting layer 117 to the digital signal-transmission layer 113, so that the digital signal is transmitted to the output stage 14 of the controller 10.

Further, an analog signal outputted from the component of the controller 10 mounted on the first mounting layer 111 or the second mounting layer 117 is transmitted to the analog signal-transmission layer 114 through a via hole (not shown) connected between the first mounting layer 111 or the second mounting layer 117 and the analog signal-transmission layer 114 so that the analog signal is transmitted to the output stage 14 of the controller 10.

Further, a power supply voltage and a cathode voltage outputted from the DC-DC converter 13 of the controller 10 mounted on the first mounting layer 111 or the second mounting layer 117 are transmitted to the power supply transmission layer 115 and then to the output stage 14 of the controller 10. The ground layer 116 is connected to the respective components mounted on the first mounting layer 111 and the second mounting layer 117 to ground the transmitted signals.

Here, a PCB or FPCB is applicable to the stacked structure of the above-described display device, which corresponds to technical characteristics of the present invention.

In an alternate embodiment of the present invention, the display device mentioned in the present invention may be a flat display device and, preferably, may be a liquid crystal display device or organic light emitting display.

As described above, because in one embodiment of the present invention the respective transmission layers 113, 114, 115 and 116 of the stacked structure 110 of the display device for transmitting the analog signal, the digital signal, and the power supply are isolated into different layers, and the insulating layers 112a, 112b, 112c, 112d and 112e for blocking electrical conduction between the respective layers are formed between the respective layers, interference of the electrical signal applied to each layer substantially does not occur, and thus noise from this source is reduced or avoided.

As described above, because in another embodiment of the present invention the transmission lines for transmitting a digital signal, an analog signal and the power supply in the stacked structure of the display device are isolated from one another, the interference due to adjacent electrical signals substantially does not occur and conductive noise is reduced or prevented, thereby significantly enhancing the quality of an image implemented on the display device.

Although the present invention has been described with reference to certain exemplary embodiments thereof, it will be understood by those skilled in the art that a variety of modifications and variations may be made to the described embodiments without departing from the spirit or scope of the present invention defined in the appended claims, and their equivalents.

What is claimed is:

1. A stacked structure of a display device having a scan driver for applying a plurality of scan signals, a data driver for applying a plurality of data signals, and a controller for providing a gradation voltage to the data driver and a scan signal to the scan driver, the stacked structure comprising:
   a ground layer;
   an analog signal-transmission layer for transmitting an analog signal;
   a digital signal-transmission layer for transmitting a digital signal; and
   a power supply transmission layer for transmitting a power supply voltage,
wherein:
   each of the layers is formed as a separate layer; and
   all digital signal-transmission layers are at a plane different from that of all analog signal-transmission layers.

2. The stacked structure of claim 1, further comprising a first mounting layer at a front of the stacked structure on which circuits are mounted; and a second mounting layer at a rear thereof on which circuits are mounted.

3. The stacked structure of claim 2, wherein the first mounting layer or the second mounting layer has a control unit and a DC-DC converter of the controller mounted thereon.

4. The stacked structure of claim 1, further comprising insulating layers formed between the respective layers to insulate the layers.

5. The stacked structure of claim 1, wherein the stacked structure is a flexible printed circuit board (FPCB).

6. The stacked structure of claim 1, wherein the stacked structure is a printed circuit board (PCB).

7. The stacked structure of claim 1, wherein the display device is a flat display device.

8. The stacked structure of claim 7, wherein the flat display device is a liquid crystal display or an organic light emitting display.

9. A stacked structure of a display device having a scan driver for applying a plurality of scan signals, a data driver for applying a plurality of data signals, and a controller for providing a gradation voltage to the data driver and a scan signal to the scan driver, the stacked structure comprising:
- a first mounting layer at a front of the stacked structure on which circuits are mounted;
- a second mounting layer at a rear thereof on which circuits are mounted;
- a ground layer;
- an analog signal-transmission layer for transmitting an analog signal;
- a digital signal-transmission layer for transmitting a digital signal;
- a power supply transmission layer for transmitting a power supply voltage, wherein each of the layers is formed as a separate layer;
- a first insulating layer between the first mounting layer and the digital signal-transmission layer;
- a second insulating layer between the digital signal-transmission layer and the analog signal-transmission layer;
- a third insulating layer between the analog signal-transmission layer and the power supply transmission layer;
- a fourth insulating layer between the power supply transmission layer and the ground layer; and
- a fifth insulating layer between the ground layer and the second mounting layer to insulate these layers.

10. A stacked structure of a display device having a scan driver for applying a plurality of scan signals, a data driver for applying a plurality of data signals, and a controller for providing a gradation voltage to the data driver and a scan signal to the scan driver, the stacked structure comprising:
- a ground plane;
- an analog signal-transmission plane for transmitting an analog signal;
- a digital signal-transmission plane for transmitting a digital signal; and
- a power supply transmission plane for transmitting a power supply voltage,
wherein the analog signal-transmission plane is between the digital signal-transmission plane and the power supply transmission plane.

11. The stacked structure of claim 10, further comprising a first mounting plane at a front of the stacked structure on which circuits are mounted; and a second mounting plane at a rear thereof on which circuits are mounted.

12. The stacked structure of claim 11, wherein the first mounting plane or the second mounting plane has a control unit and a DC-DC converter of the controller mounted thereon.

13. The stacked structure of claim 10, further comprising insulating layers formed between the respective planes to insulate the planes.

14. The stacked structure of claim 10, wherein the stacked structure comprises a flexible printed circuit board (FPCB).

15. The stacked structure of claim 10, wherein the stacked structure comprises a printed circuit board (PCB).

16. The stacked structure of claim 10, wherein the display device comprises a flat panel display device.

17. The stacked structure of claim 16, wherein the flat panel display device comprises a liquid crystal display or an organic light emitting display.

18. The stacked structure of claim 10, further comprising:
- a first insulating layer between the first mounting plane and the digital signal-transmission plane;
- a second insulating layer between the digital signal-transmission plane and the analog signal-transmission plane;
- a third insulating layer between the analog signal-transmission plane and the power supply transmission plane;
- a fourth insulating layer between the power supply transmission plane and the ground plane; and
- a fifth insulating layer between the ground plane and the second mounting plane.

* * * * *